United States Patent [19]

Kuo

[11] 4,342,099
[45] Jul. 27, 1982

[54] ELECTRICALLY ERASABLE PROGRAMMABLE MNOS READ ONLY MEMORY

[75] Inventor: Chang-Kiang Kuo, Houston, Tex.

[73] Assignee: Texas Instruments Incorporated, Dallas, Tex.

[21] Appl. No.: 49,526

[22] Filed: Jun. 18, 1979

[51] Int. Cl.³ .............................. G11C 11/40
[52] U.S. Cl. .................... 365/104; 365/184; 357/23
[58] Field of Search .............. 365/103, 104, 174, 184; 307/238, 279; 357/23 R

[56] References Cited

U.S. PATENT DOCUMENTS

| | | | |
|---|---|---|---|
| 3,691,537 | 9/1972 | Burgess et al. | 365/184 |
| 3,728,695 | 4/1973 | Frohman-Bentchkowsky | 365/184 |
| 3,781,831 | 12/1973 | Neugebauer et al. | 365/184 |
| 4,090,257 | 5/1978 | Williams | 365/184 |
| 4,103,185 | 7/1978 | Denes | 365/184 |
| 4,122,544 | 10/1978 | McElroy | 365/104 |

Primary Examiner—Terrell W. Fears
Attorney, Agent, or Firm—John G. Graham

[57] ABSTRACT

An electrically programmable read only memory or EPROM is formed by an MNOS process compatible with N-channel silicon gate manufacturing methods. Row address lines and gates are second level polysilicon, and output and ground lines are defined by elongated N+ regions formed beneath thin field oxide. Each storage cell is an MNOS transistor having an enhancement mode MOS transistor in series with it. The gates of the MNOS transistors are program address lines for programming and are formed by first level polycrystalline silicon. Each MNOS transistor in the array is programmed to be a logic "1" or "0" by proper voltages applied to row, output and program address lines to store charge at the oxide-nitride interface and thus change the threshold voltage for selected transistors. Then readout is provided using the MOS series transistors for access. A very dense array results.

14 Claims, 16 Drawing Figures

4,342,099

ELECTRICALLY ERASABLE PROGRAMMABLE MNOS READ ONLY MEMORY

BACKGROUND OF THE INVENTION

This invention relates to semiconductor memory devices, and more particularly to an electrically erasable programmable MNOS read only memory.

Semiconductor memory devices are widely used in the manufacture of digital equipment such as minicomputers and microprocessor systems. Storage of fixed programs is usually provided in these systems by MOS read only memory devices or "ROMs." ROMs are made by semiconductor manufacturers on special order, the programming code being specified by the customer. The manufacturing process is lengthy, requiring dozens of steps, each taking up time and introducing materials handling and inventory factors. Customers require the turn-around time or cycle time between receipt of the ROM code for a custom order and delivery of finished parts to be kept as short as possible. For this reason, programming should be done late in the manufacturing process, but previous ways of doing this required large cell size. The economics of manufacture of ROMs, and of mounting them on circuit boards in the system, are such that the number of memory bits per semiconductor chip is advantageously as high as possible. ROMs of up to 32K bits (32768) are typical at present. Within a few years, standard sizes will progress through 64K, 128K, 256K and 1 megabit. This dictates that cell size for the storage cells of the ROM be quite small. P-channel ROMs of small size can be relatively easily fabricated in the manner set forth in U.S. Pat. No. 3,541,543, assigned to Texas Instruments, but usually these are programmed by the gate level mask which is at an early stage in the process. Most microprocessor and computer parts are now made by the N-channel silicon gate process because of the shorter access times provided. In the past, the N-channel process has not been favorable to layout of ROM cells of small size and/or programming has been by the moat mask, also early in the process. N-channel ROMs are disclosed in prior applications Ser. No. 762,612, filed Jan. 29, 1977 and Ser. No. 701,932, filed July 1, 1976, assigned to Texas Instruments. Prior electrically programmable and electrically erasable ROMs are disclosed in U.S. Pat. Nos. 4,122,509 and 4,122,544, and pending applications Ser. No. 957,518 filed Nov. 2, 1978 and Ser. No. 1,095, filed Jan. 5, 1979, all assigned to Texas Instruments.

It is the principal object of this invention to provide a semiconductor memory cell of small size which may be electrically programmed. Another object is to provide a small-area memory cell which is made by a process compatible with standard manufacturing techniques and is electrically programmable.

SUMMARY OF THE INVENTION

An electrically programmable read only memory or EPROM is formed by an MNOS process compatible with N-channel silicon gate manufacturing methods. Row address lines and gates are second level polysilicon, and output and ground lines are defined by elongated N+ regions formed beneath thin field oxide. Each storage cell is an MNOS transistor having an enhancement mode MOS transistor in series with it. The gates of the MNOS transistors are program address lines for programming and are formed by first level polycrystalline silicon. Each MNOS transistor in the array is programmed to be a logic "1" or "0" by proper voltages applied to row, output and program address lines to store charge at the oxide-nitride interface and thus change the threshold voltage for selected transistors. Then readout is provided using the MOS series transistors for access. A very dense array results.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENTS

Figure 1:
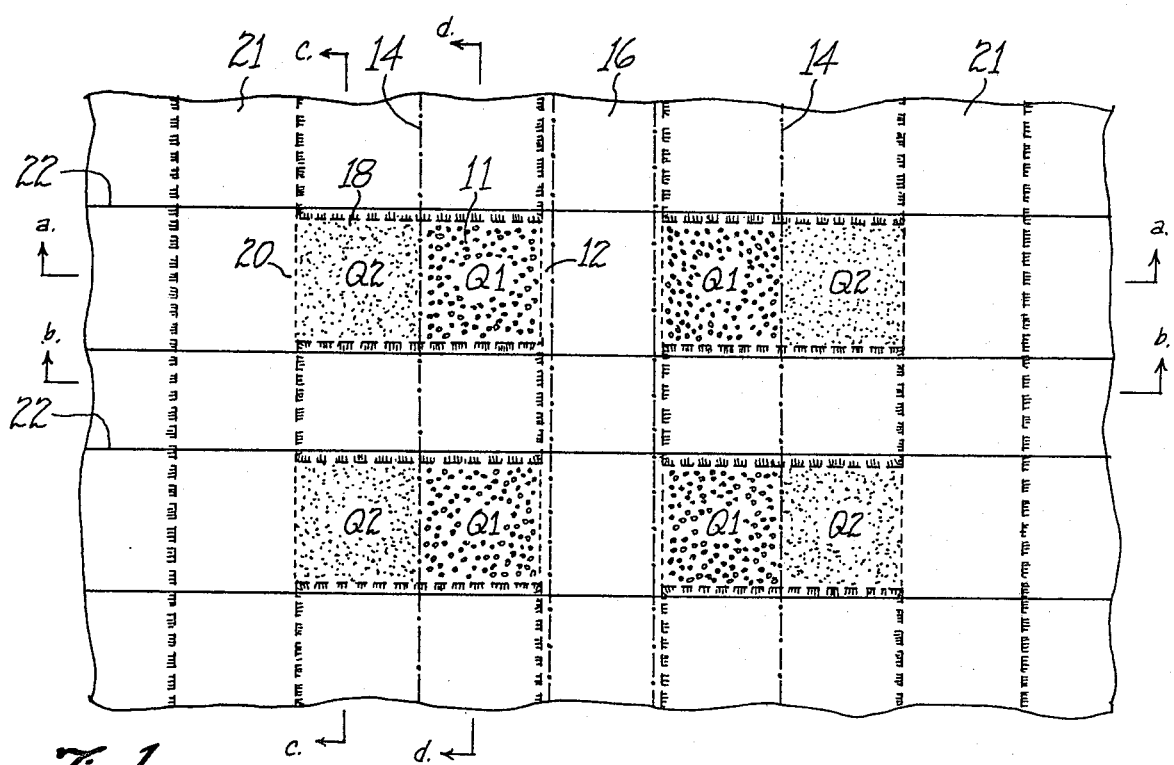
FIG. 1 is a greatly enlarged plan view of a small portion of a semiconductor chip showing the physical layout of a part of a memory array made according to the invention.
Figure 2:
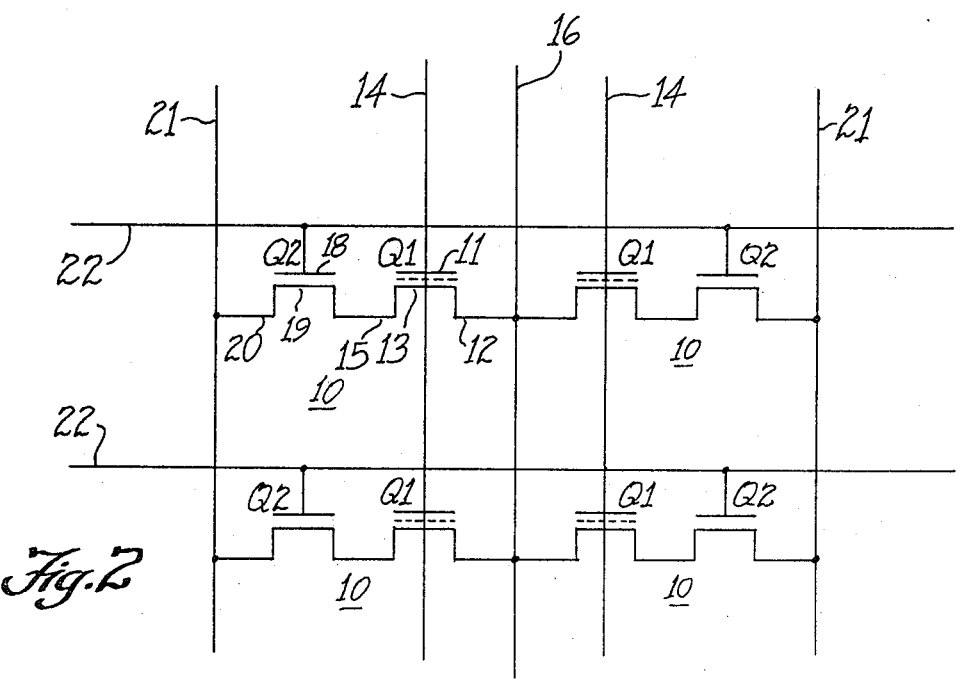
FIG. 2 is an electrical schematic diagram of the device of FIG. 1.

With reference to FIGS. 1, 2 and 3a–3d an electrically programmable read only memory is illustrated according to the invention. The array consists of a large number of cells 10, only four of which are shown. Each cell has an MNOS transistor Q1 having a gate 11, a source 12 and a channel 13. The gates 11 are parts of first level polysilicon strips 14 which are the program address lines for the array. The drain 15 of the MNOS transistor is formed by inverting the channel of its series transistor. The sources 12 are part of an N+ diffused region 16 which is connected to Vss for read. In series with each MNOS transistor is an enhancement mode transistor Q2 having a gate 18, a channel 19 and a drain 20. The drains are part of N+ diffused regions 21 which are Y output lines. The gates 18 in each column are connected together by and form part of a second level polysilicon strip 22 which is an X address line. The array, formed on a silicon bar 23, would typically contain perhaps 64K, 128K or 256K cells; the bar would be less than about 200 mils on a side or 40,000 sq. mil in area, depending upon the bit density. The four cells 10 shown would be on a minute part of the bar, perhaps one or two mils wide. A 64K array would require 256 of the X address lines 22 and 256 of the Y lines 21, providing 65,536 bits. Although one Vss line 16 is shown for two Y lines 21, the array could be of a virtual ground type as disclosed in U.S. Pat. No. 3,934,233, issued to Roger J. Fisher and Gerald D. Rogers or U.S. Pat. No. 4,021,781 issued to Edward R. Caudel, both assigned to Texas Instruments, in which case one Vss line for each eight or sixteen Y lines would be all that would be needed. Alternatively, the array could be of a virtual ground type wherein no dedicated ground lines are used, but instead one Y line is selected as ground, depending upon the Y address.

The cell array is programmed by storage of charge at the interface between nitride and oxide dielectric layers 24 and 25 in the MNOS transistors Q1 to raise the threshold voltage of selected ones of the cells to a value above that which will be turned on by the voltage on the selected address line 22.

Turning now to FIGS. 4a–4d, a process for making the ROM array of the invention will be described. The starting material is a slice of P-type monocrystalline silicon, typically 3 or 4 inches in diameter and twenty mils thick, but on the <100> plane, of a resistivity of about 6 to 8 ohm-cm. As above, in the FIGURES the portion of the bar 23 which is shown represents only a very small part of the slice, perhaps one or two mils wide. After appropriate cleaning, the slice is oxidized by exposing to oxygen in a furnace at an elevated temperature of perhaps 1100° C. to produce an oxide layer 31 over the entire slice of a thickness of about 1000 Å. Next, a layer 32 of silicon nitride of about 1000 Å thickness is formed over the entire slice by exposing to an atmosphere of dichlorosilane and ammonia in a reactor. A coating of photoresist is applied to the entire top surface of the slice, then exposed to ultraviolet light through a mask which is referenced to as the moat mask and defines the desired pattern of thick field oxide 28 and the P+ channel stop 29. The resist is developed, leaving areas where nitride is then etched away by a nitride etchant, removing the exposed part of the nitride layer 32 but leaving in place the oxide layer 31; the nitride etchant does not react with the photoresist. Using photoresist and nitride as a mask, the slice is now subjected to an ion implant step to produce the channel stop regions 29, whereby boron atoms are implanted into unmasked regions 33 of silicon at a dosage of about $10^{13}$ per sq. cm at 150 KeV. Usually the slice would be subjected to a heat treatment after implant but prior to field oxide growth, as set forth in U.S. Pat. No. 4,055,444, assigned to Texas Instruments.

Figure 4:
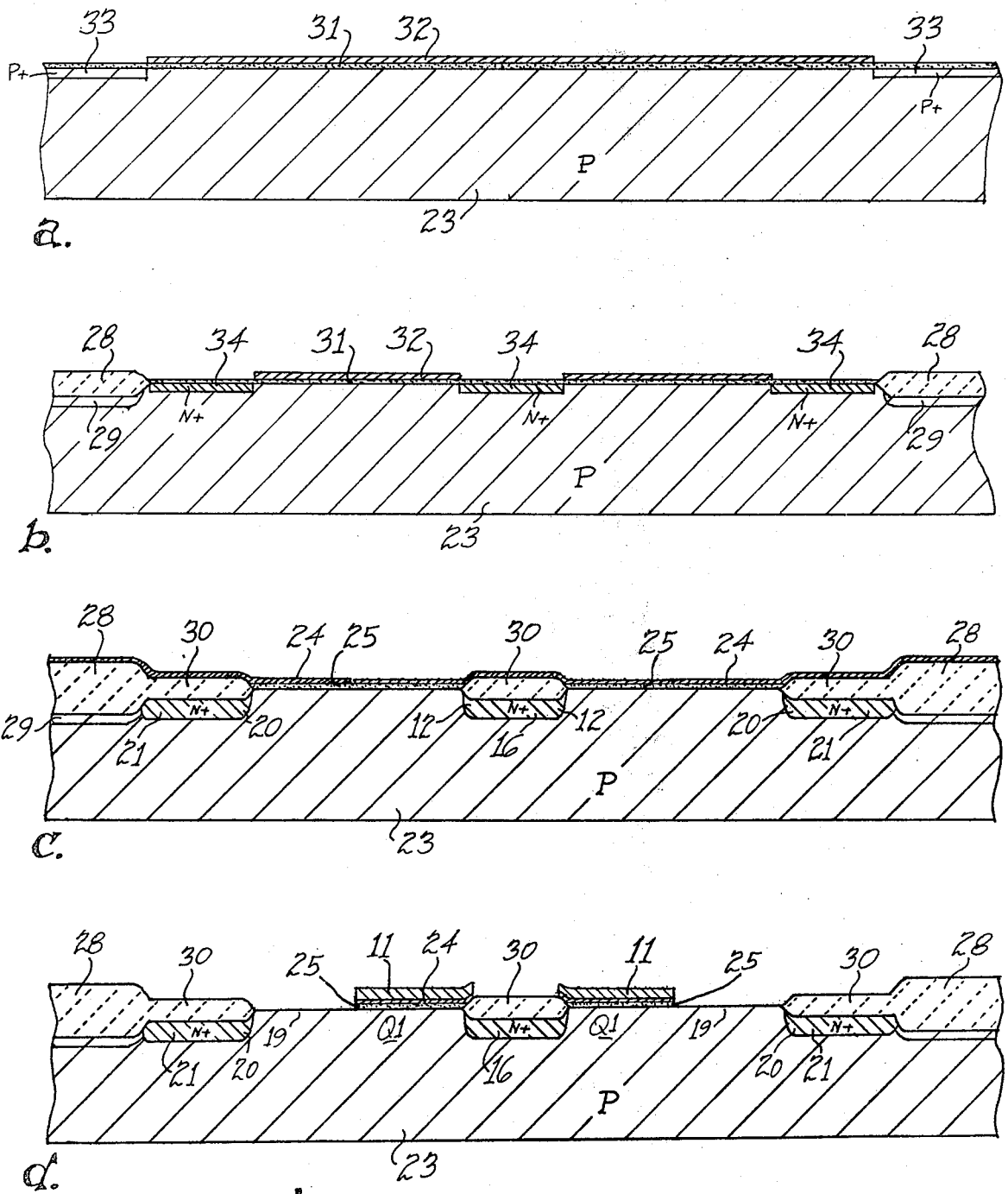
FIGS. 4a–4d are elevation views in section of the device of FIGS. 1 and 3a–3d, at successive stages in the manufacturing process, taken generally along the line a—a in FIG. 1.
Figure 5:
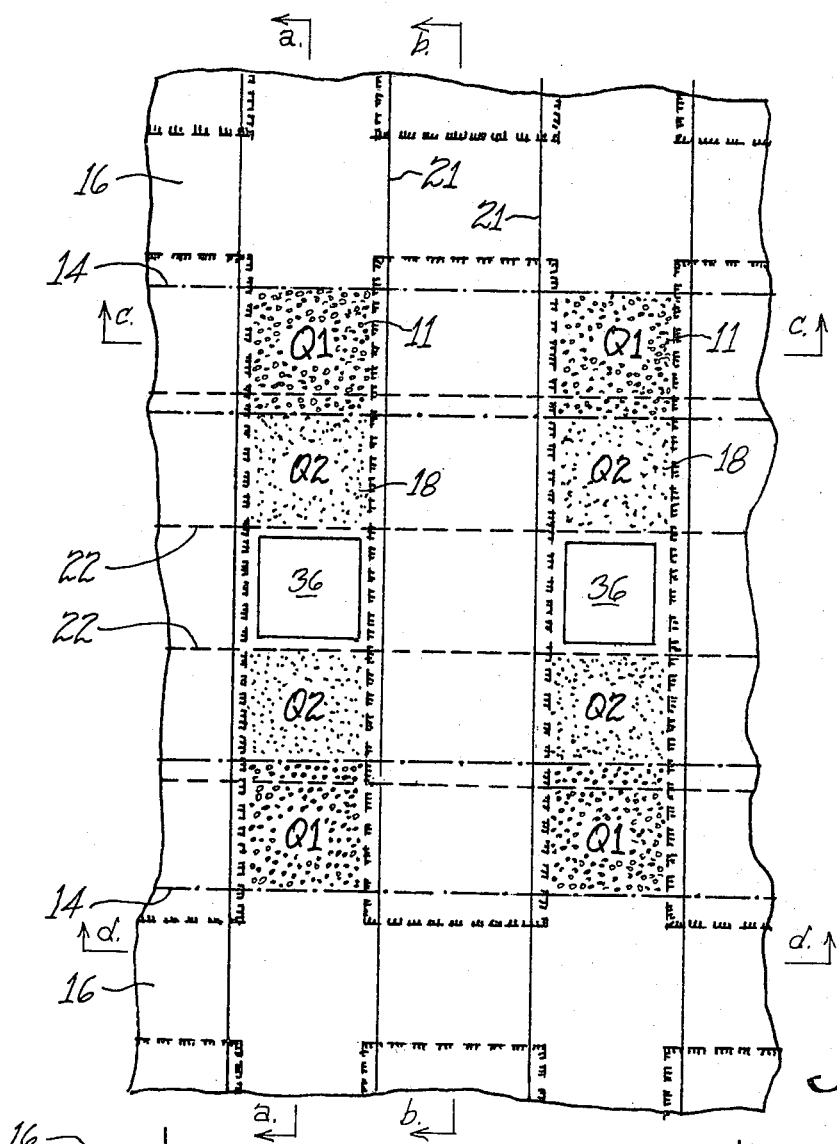
FIGS. 5, 5a and 6 are plan, schematic and section views of another embodiment made by a standard N-channel process.
Figure 5A:
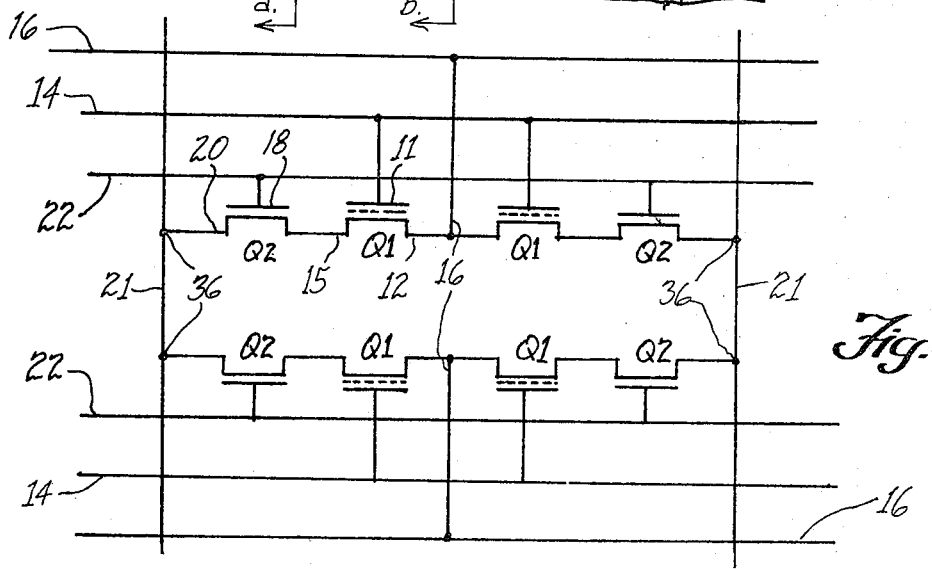
Figure 6:
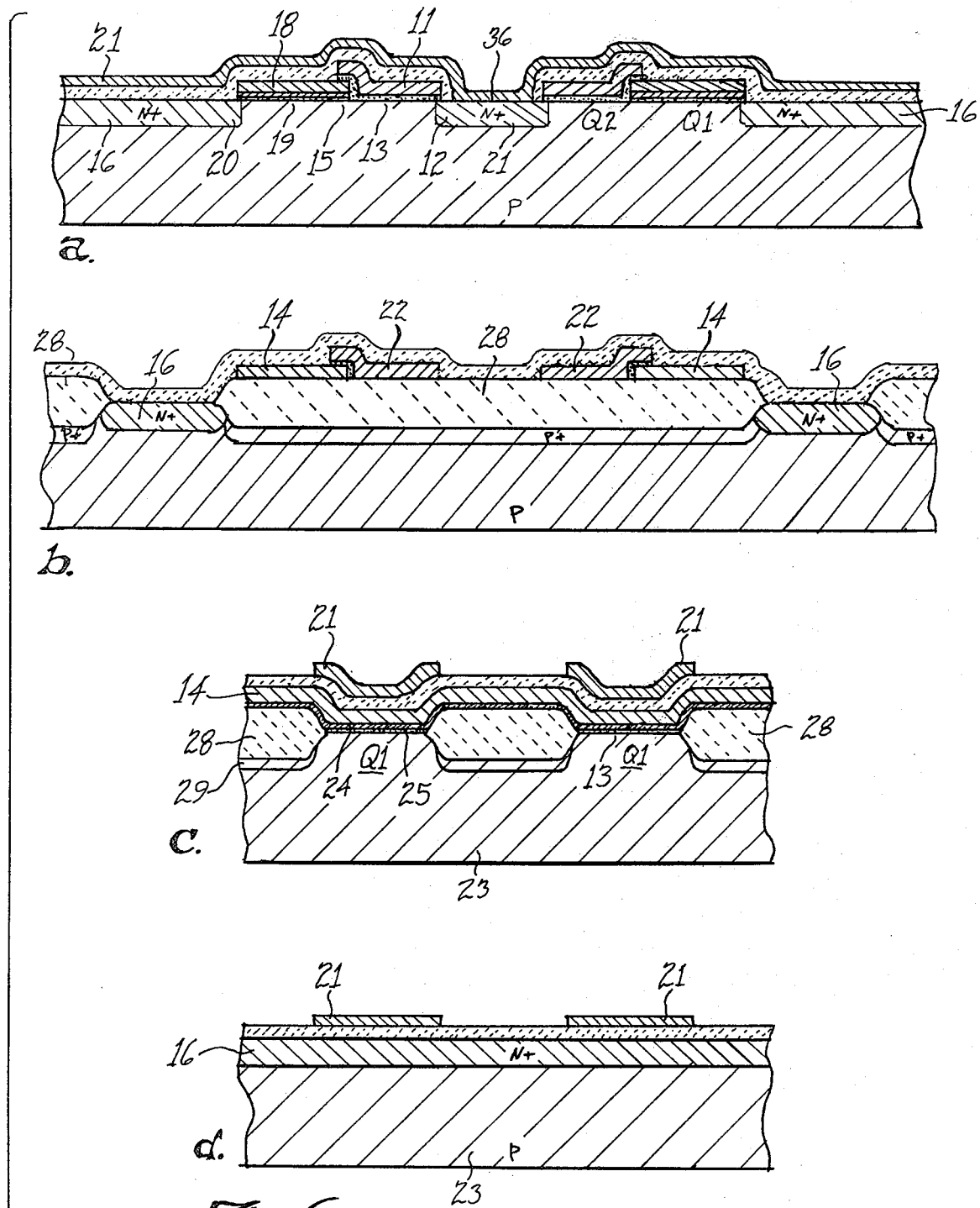

The next step in the process is formation of field oxide 28, which is done by subjecting the slices to steam or an oxidizing atmosphere at about 900° C. for perhaps five hours. This causes a thick field oxide region or layer 28 to be grown as seen in FIG. 4b. This layer extends into the silicon surface because silicon is consumed as it oxidizes. The remaining parts of the nitride layer 32 mask oxidation. The thickness of this layer 28 is about 6000 Å, about half of which is above the original surface and half below. The boron doped P+ regions 33 formed by implant will be partly consumed, but will also diffuse further into the silicon ahead of the oxidation front. Thus, P+ field stop regions 29 will result which will be much deeper than the original regions 33. At this point, the field oxide layer 28 is not nearly as thick as it will be in the finished device. Additional thickness results from subsequent heat treatments.

The slice now coated with another photoresist layer and then exposed to ultraviolet light through a mask which defines the source and drain areas 12 and 20 as well as the lines 16 and 21 which are to be N+ diffused. After developing the photoresist the slice is again subjected to a nitride etchant which removes the parts of the nitride layer 32 now exposed by holes in the photoresist. The parts of the oxide layer 31 exposed when this nitride is removed are then etched to expose bar silicon as seen in FIG. 4b. A phosphorus diffusion produces N+ regions 34 which will subsequently become the sources, drains and interconnections. Instead of diffusion, these N+ regions 34 may be formed by ion implant, in which case the oxide layer 31 would be left in place and an anneal step used before the subsequent oxidation.

Referring to FIG. 4c, a second field oxidation step is now performed by placing the slice in steam or dry oxygen at about 1000° C. for several hours. This oxidizes all of the top of the slice not covered by the remaining parts of the nitride layer 32, producing field oxide 30 which is about 5000 Å thickness. During this oxidation, the areas of field oxide 28 grow thicker, to perhaps 10,000 Å. The N+ regions 34 are partly consumed but also diffuse further into the silicon ahead of the oxidation front to create the heavily doped regions 12, 16, 20 and 21.

Next the remaining nitride layer 32 is removed by an etchant which attacks nitride but not silicon oxide, then the oxide 31 is removed by etching and the exposed silicon cleaned. The gate oxide 25 is grown by thermal oxidation to a thickness of about 15 to 50 Å. In areas of the slice where depletion load devices are required, although not pertinent to this invention, a masked ion implant step would be done at this point. Likewise, the threshold voltage of the enhancement mode transistors in the array or periphery may be adjusted by ion implant. A layer 24 of silicon nitride is then deposited to a thickness of ~500 to ~800 Å to complete the dual dielectric. Windows for first level pholysilicon to silicon contacts, if needed, are patterned and etched at this point using photoresist; none are needed in the array itself as shown.

As seen in FIG. 4d a first layer of polycrystalline silicon is deposited over the entire slice in a reactor using standard techniques to a thickness of about 5000 Å. This layer is N+ doped by a phosphorus diffusion to make it highly conductive. The first level polysilicon layer is patterned by applying a layer of photoresist, exposing to ultraviolet light through a mask prepared for this purpose, developing, then etching both photoresist and exposed nitride 24 and oxide 25. The unmasked polycrystalline silicon is etched away, so the resulting structure seen in FIG. 4d includes a part of the remaining polysilicon layer which provides what will be the gates 11 of an N-channel MNOS transistors Q1 in the array, as well as the programming line 14.

Figure 3:
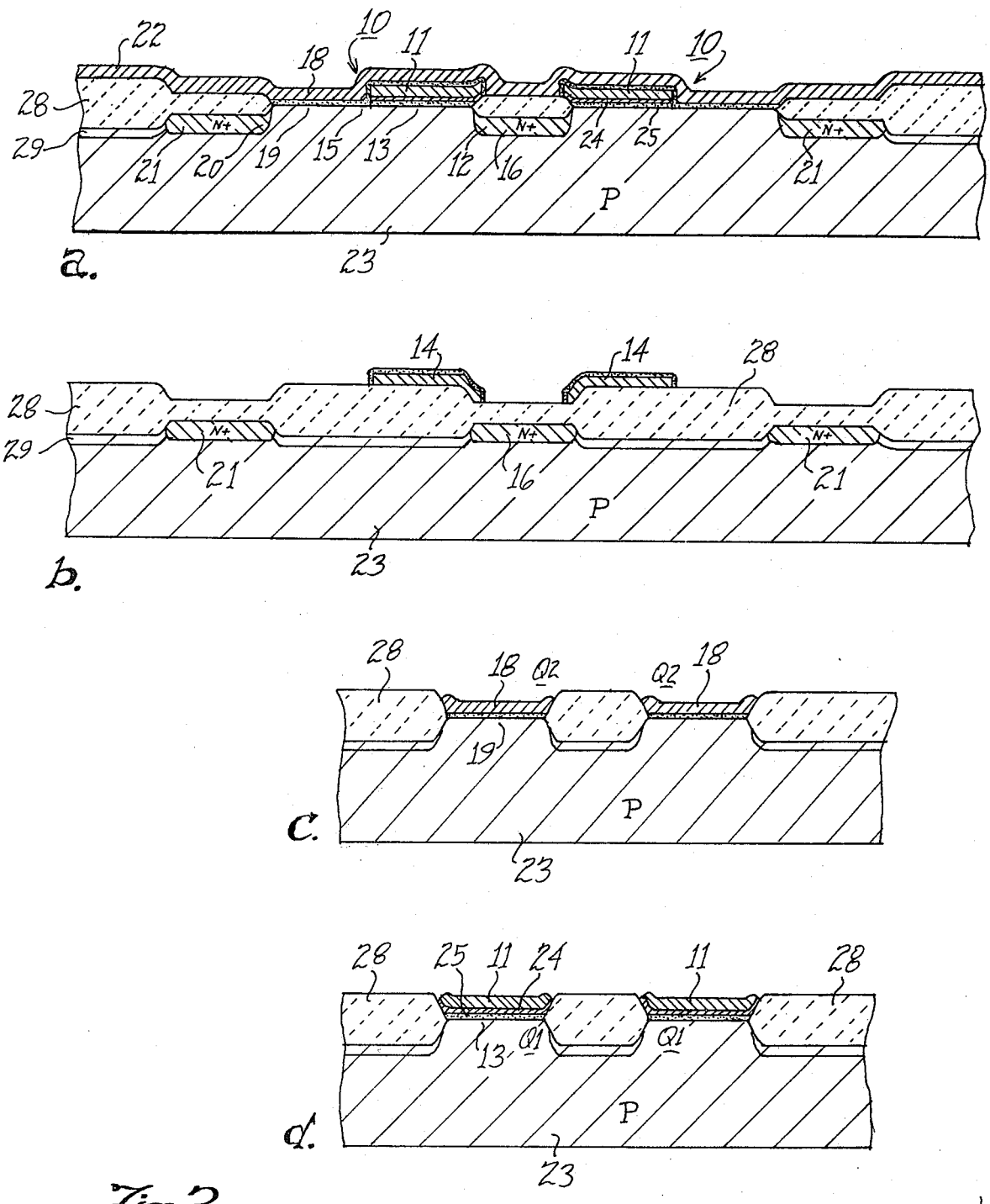
FIGS. 3a–3d are elevation views in section of the cell of FIG. 1, taken along the lines a—a, b—b, c—c, and d—d, respectively.

A thin layer 26, 27 of silicon oxide, perhaps 500 to 800 Å, is grown by thermal oxidation as seen in FIG. 3a. The layer 27 functions as the gate insulator 26 for the transistors Q2, and as an insulator 27 between first and second level polysilicon.

A layer of polycrystalline silicon is next deposited over the entire slice using standard methods, then patterned using photoresist to leave the address lines 22. This completes the memory array, although peripheral device would require further process steps such as deposition of interlevel oxide, oxide removal for metal to poly or metal to silicon contacts, metal deposition and patterning, formation of protective overcoat, then patterning to open bonding pad areas. The slices would be scribed and broken into several hundred individual bars per slice, and the bars mounted in packages.

In operation, for a write condition the address line 22 for the row of the selected cell is taken to +Vp, a high voltage such as +25 V., and the common source line 16 is also taken to +Vp. The bit line or Y output line 21 for the selected cell is taken to +Vp or to Vss, depending upon whether a "1" or a "0" is to be written in. All the other lines 21 will be at +Vp, no field will exist across the dielectric layers 24,25 of the MNOS transistors Q1, and no charge will be stored at the interface for the non-selected cells. For the selected cell, if the bit line is at Vss, a high electric field will be created and the interface between oxide and nitride will store a charge. This will shift the threshold of the transistor Q1 to perhaps +8 V. from about +1 V., for an N-channel enhancement mode device. For depletion mode devices, the shift may be from −4 V. to +4 V. For read operation, the lines 14 are held at about 2 or 3 V., just above threshold (for enhancement), or grounded (for depletion), for the entire array, and the lines 16 are grounded. The line 22 for the selected cell is taken to logic 1 or +5 V., for example, while all the other lines 22 are at ground. Thus, the output line 21 for the selected cell will conditionally discharge depending upon whether a "1" or a "0" was stored.

It is important that the read-disturb condition prevalent in MNOS devices is minimized in this invention, since the program gate 11 is separate from the address line 22. Repeated cycling of the address lines 22 between Vss and logic 1 voltage, when applied to the gate of the MNOS transistors in conventional devices, tends to destroy the stored charge after thousands of cycles. This does not occur in the cell of the invention.

In place of a "SATO" type process as disclosed above, the cells of the invention may be constructed by a standard "NSAG" process in which case the memory will be of the form shown in FIGS. 5 and 6a–6d, which are the same types of views discussed above. The main difference is that the lines 14 will be parallel to the address lines 22 rather than parallel to the output lines 21.

To erase the MNOS cell of the invention, a negative field must be applied across the oxide-nitride interface. That is, the gate 11 must be negative with respect to the channel 13. According to standard MNOS practice, this is done by holding the line 14 at ground and applying a large positive voltage on the source 12, drain 13 and substrate (or tank). To avoid forward biasing a PN junction and dissipating large amounts of power, usually the cell array (as well as peripheral decoders) are made in P tanks. The term MNOS transistor as used herein is intended to include other multiple-dielectric type EAROM transistor devices. The layers 24 and 25 of thermal silicon oxide and silicon nitride can be replaced by other materials. For example, titanium dioxide may be used in place of silicon nitride; another thin layer of silicon oxide may be used over the titanium dioxide in this case.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is, therefore contemplated that the appended claims will cover any such modifications or embodiments as fall within the true scope of the invention.

What is claimed is:

1. A method of operating a semiconductor device of the type having a plurality of insulated gate field effect transistor cells in a face of a semiconductor body, each of the transistor cells having an MNOS transistor and an MOS transistor, each transistor having a source-drain path and a gate, the transistor cells being in a regular pattern to provide a memory array; the source-drain paths of the MNOS transistor and the MOS transistor being connected in series in each cell; said method comprising the steps of: programming the array of memory cells by applying voltage to the gates of both transistors in selected cells; and reading the array by applying voltage to the gate of only the MOS transistor in a selected cell; wherein the source-drain paths of the MNOS transistor and MOS transistor in each cell are formed between heavily-doped semiconductor regions which define the ground and output lines for the array.

2. A method according to claim 1 wherein said ground and output lines are formed beneath thin field oxide.

3. A method according to claim 1 wherein the gate of the MNOS transistor is formed of first level polysilicon and the gate of the MOS transistor is formed of second level polysilicon.

4. A method according to claim 3 wherein the gates of the MNOS transistors are formed as parts of a column address lines and the gates of the MOS transistors are formed as parts of row address lines.

5. A read only memory array comprising: a plurality of memory cells formed at a face of a silicon body in an array of rows and columns; each memory cell including two insulated gate field effect transistors each having a source-to-drain path and a gate, the source-to-drain paths of the two transistors in each cell being connected in series between a connection to a column line and a reference potential; a plurality of parallel sets of row address lines, one row address line in each set forming the gate of a first of the transistors in each cell in a row of cells; the other row address line in each set of said plurality of row address lines forming the gate of a second of the transistors in each cell of a plurality of cells in a row; said second transistors being electrically programmable.

6. A device according to claim 5 wherein said second transistors are MNOS transistors.

7. A device according to claim 6 wherein said column lines are column address lines overlying said cells and extending perpendicular to said row address lines.

8. A device according to claim 7 wherein said connection to a reference potential includes elongated heavily-doped semiconductor regions.

9. A device according to claim 8 wherein the row address lines are polysilicon and the column address lines are metal.

10. A read only memory array comprising: a plurality of memory cells formed at a face of a silicon body in an array of rows and columns; each memory cell including two insulated gate field effect transistors each having a source-to-drain path and a gate, the source-to-drain paths of the two transistors in each cell being connected in series; each cell in each column being connected to one of a plurality of parallel column lines formed by heavily-doped regions beneath field oxide; a plurality of row address lines, each row address line forming the gate of a first of the transistors in each cell in a row of cells; a plurality of programming address lines, each of which forms the gate of a second of the transistors in each cell of a plurality of cells in a row; the row address lines extending across said column lines; said second transistors being electrically programmable.

11. A device according to claim 10 wherein said second transistors are MNOS transistors.

12. A device according to claim 11 wherein said programming address lines are parallel to the column lines.

13. A device according to claim 10 wherein said programming address lines are elongated strips perpendicular to the row address lines.

14. A device according to claim 13 wherein the row address lines are metal and the programming address lines are polysilicon.

* * * * *